(12) United States Patent
Loo et al.

(10) Patent No.: US 9,978,543 B1
(45) Date of Patent: May 22, 2018

(54) MAGNET KEYS

(75) Inventors: Kenneth Loo, San Jose, CA (US); Lawrence Lam, San Jose, CA (US)

(73) Assignee: Google LLC, Mountain View, CA (US)

( * ) Notice: Subject to any disclaimer, the term of this patent is extended or adjusted under 35 U.S.C. 154(b) by 718 days.

(21) Appl. No.: 13/469,552

(22) Filed: May 11, 2012

(51) Int. Cl.
*H01H 13/02* (2006.01)
(52) U.S. Cl.
CPC .................... *H01H 13/02* (2013.01)
(58) Field of Classification Search
USPC ............... 345/168, 160; 200/308, 5 A, 520
See application file for complete search history.

(56) References Cited

U.S. PATENT DOCUMENTS

| | | | |
|---|---|---|---|
| 2005/0226669 A1* | 10/2005 | Cheng | 400/490 |
| 2007/0084704 A1* | 4/2007 | Meyer et al. | 200/5 R |
| 2008/0106523 A1 | 5/2008 | Conrad | |
| 2008/0185279 A1* | 8/2008 | Lin | 200/344 |
| 2008/0193187 A1* | 8/2008 | Tsai | 400/472 |
| 2011/0142522 A1* | 6/2011 | Yeh | 400/474 |
| 2012/0199455 A1* | 8/2012 | Niu et al. | 200/308 |
| 2013/0146435 A1* | 6/2013 | Tsai | 200/517 |
| 2013/0313096 A1* | 11/2013 | Zhang | 200/520 |

OTHER PUBLICATIONS

"Newlaunches.com" [online]. [Retrieved Feb. 22, 2012] Retrieved from the internet: <http://www.newlaunches.com/archives/embotec_keyboard_uses_magnetic>, 2 pages.
"My Digital Life" [online] [Retrieved Feb. 22, 2012] Retrieved from the internet: <http://www.mydigitallife.info/embotec-unveiled-magnetic-levitation>, 3 pages.

* cited by examiner

*Primary Examiner* — Tony Davis
(74) *Attorney, Agent, or Firm* — Lerner, David, Littenberg, Krumholz & Mentlik, LLP

(57) ABSTRACT

Aspects of the disclosure relate generally to keyboards for computing devices. For example, rather than using a dome, the keycap may include one or more magnets. In one example, a second magnet may be placed adjacent to a switch or magnetic sensor on a circuit board. The magnets may be arranged so that they repel one another in order to force the keycap away from the switch. Webbing between the keycaps may be used to keep the keycaps from falling off of the device. To keep the keycap from moving laterally, the keycap may include two or more flanges held in place by rails. Other arrangements of magnets or magnetic plates may also be used. If a magnetic sensor is used, it may be calibrated to adjust the sensitivity of the keys, for example, how far a user must press the keycap in order to have the pressing register.

24 Claims, 19 Drawing Sheets

MAGNET KEYS

BACKGROUND

Many computing devices, such as mobile phones, personal digital assistants, tablet PCs, netbooks, laptop computers, desktop computers, and e-book readers include user input buttons or keys. FIG. 1 is a cross-sectional view of a typical key in a conventional keyboard of the prior art. In this example, a key 100 is adjacent to a top enclosure 110 for the keyboard. The key includes a key cap 120, a hinge 130, and a rubber dome 140. Below the key is an electrical switch 150 connected to a circuit board or flexible printed circuit 160. When a user presses on the key 100, the key cap 120 compresses the rubber dome 140. The rubber dome 140 physically contacts the electrical switch 150. The rubber dome 140 also generates a spring force that pushes key 100 up towards the top enclosure 110 after depression. The feel and travel of keycaps is limited by manufacturing and reliability issues associated with rubber domes and hinges. The rubber domes also occupy a lot of space underneath the keycaps, especially in devices with a relatively thin profile, for example a few centimeters or less.

SUMMARY

One aspect of the disclosure provides a device. The device includes a key for inputting information in response to input by a user. The key includes a keycap having a contact surface for receiving user input. The keycap has a set of flanges and a magnet mounted to the keycap. The device also includes a circuit board for providing information to a processor. The information indicates whether the contact surface has been pressed. The device also includes an input apparatus associated with the circuit board. The input apparatus is configured to generate the information. The device also includes webbing adjacent to the set of flanges. The webbing is configured to prevent the keycap from being removed from the device.

In one example, a flange of the set of flanges includes a surface oriented towards the webbing, and the magnet is mounted to the flange surface. In an alternative, the device also includes a magnetic plate mounted on a surface of the webbing oriented towards the circuit board. In this alternative, the magnet is mounted such that opposing poles of the magnetic plate and the magnet are oriented towards one another, and the magnetic plate and the magnet attract one another. In another example of this alternative, the device is configured such that a rest position of the key includes the magnet contacting the magnetic plate.

In another example, the device also includes a second magnet mounted on a surface of the webbing oriented towards the circuit board. In this example, the magnet is mounted such that opposing poles of the second magnet and the magnet are oriented towards one another, and the magnetic plate and the magnet attract one another. In an alternative of this example, the device is configured such that a rest position of the key includes the magnet contacting the second magnet.

In one example, a flange of the set of flanges includes a surface oriented towards the circuit board, and wherein the magnet is mounted to the surface. In this example, the device also includes a magnetic plate mounted on a surface of the webbing oriented towards the circuit board. The magnet is also mounted such that opposing poles of the magnetic plate and the magnet are oriented towards one another, and the magnetic plate and the magnet attract one another. In an alternative, the device is configured such that a rest position of the key includes the flanges contacting the magnetic plate.

In another example, the keycap includes a surface opposite of the contact surface, and the surface is oriented towards the circuit board. In this example, the device also includes a second magnet between the magnet and the circuit board. In another example, the second magnet is positioned such that identical poles of the magnetic plate and the magnet are oriented towards one another, and the magnetic plate and the magnet repel one another. In this example, the device is configured such that a rest position of the key includes the flanges contacting the webbing.

In another example, the device also includes a set of rails positioned between the webbing and the circuit board, the set of rails being positioned to limit movement of the keycap laterally between the circuit board and the webbing. In this example, a flange of the set of flanges includes a hole for receiving a rail of the set of rails. In an alternative, a flange of the set of flanges includes a slot for receiving a rail of the set of rails. In another alternative, the rails of the set of rails are positioned along the set of flanges.

In another example, the input apparatus includes a mechanical switch configured to indicate to the processor that the key has been pressed when the mechanical switch is contacted. In this example, the input apparatus includes a magnetic field sensor. In an alternative, the input apparatus includes a Hall-effect sensor. In another example, input apparatus is configurable to allow a user to adjust sensitivity of the key.

Another aspect of the disclosure provides a method of receiving input at a device. The device includes a contact surface of a keycap of a key. The key includes a magnet mounted to the keycap. The keycap has a set of flanges. The device also includes webbing located adjacent to the set of flanges and configured to prevent the keycap from being removed from the device. The device also includes a magnetic feature mounted on a surface of the webbing. The method includes receiving input at the key wherein the input includes a force on the contact surface sufficient to force the magnet away from the magnetic feature. The method also includes detecting the input at an input apparatus associated with a circuit board. The method also includes sending input information from the input apparatus to a processor via the circuit board.

In one example, the method also includes receiving the input information at the processor and displaying, on a display of the device, information associated with the key. In this example, the method also includes comparing the input information to a threshold value to determine whether the key has been pressed before displaying the information associated with the key. In another example, the input apparatus includes a Hall-effect sensor configured to detect changes in the magnetic fields of the magnet and the magnetic feature and the method further comprising adjusting a sensitivity value of the Hall-effect sensor to change a distance the key must travel from the input in order to register at the Hall-effect sensor.

DETAILED DESCRIPTION

Figure 1:
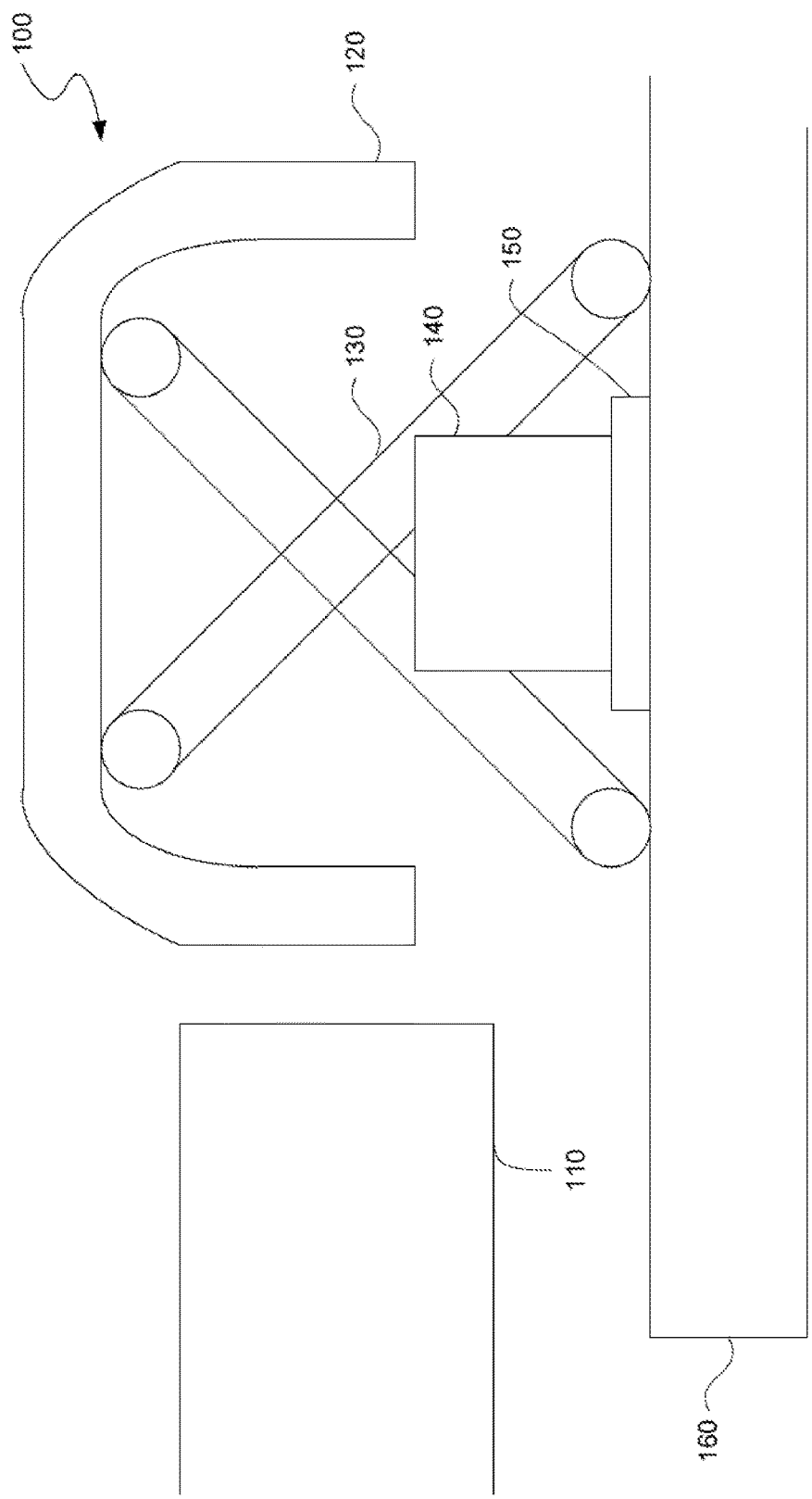
FIG. 1 is a cross-sectional view of a typical user input key in a conventional keyboard.

Aspects of the disclosure relate generally to keys for computing devices. As described above with regard to FIG. 1, typical keyboards may include an electrical switch and a spring mechanism for determining when a keycap has been pressed. The spring mechanism may include a rubber dome. The rubber dome may occupy a relatively large amount of space underneath the keycap. The disclosure includes removing the rubber dome and using magnets in conjunction with a switch or other sensor to determine when the keycap has been pressed. By doing so, the volume of space required for the keys may be reduced. This may be especially beneficial in very thin devices.

Figure 2:
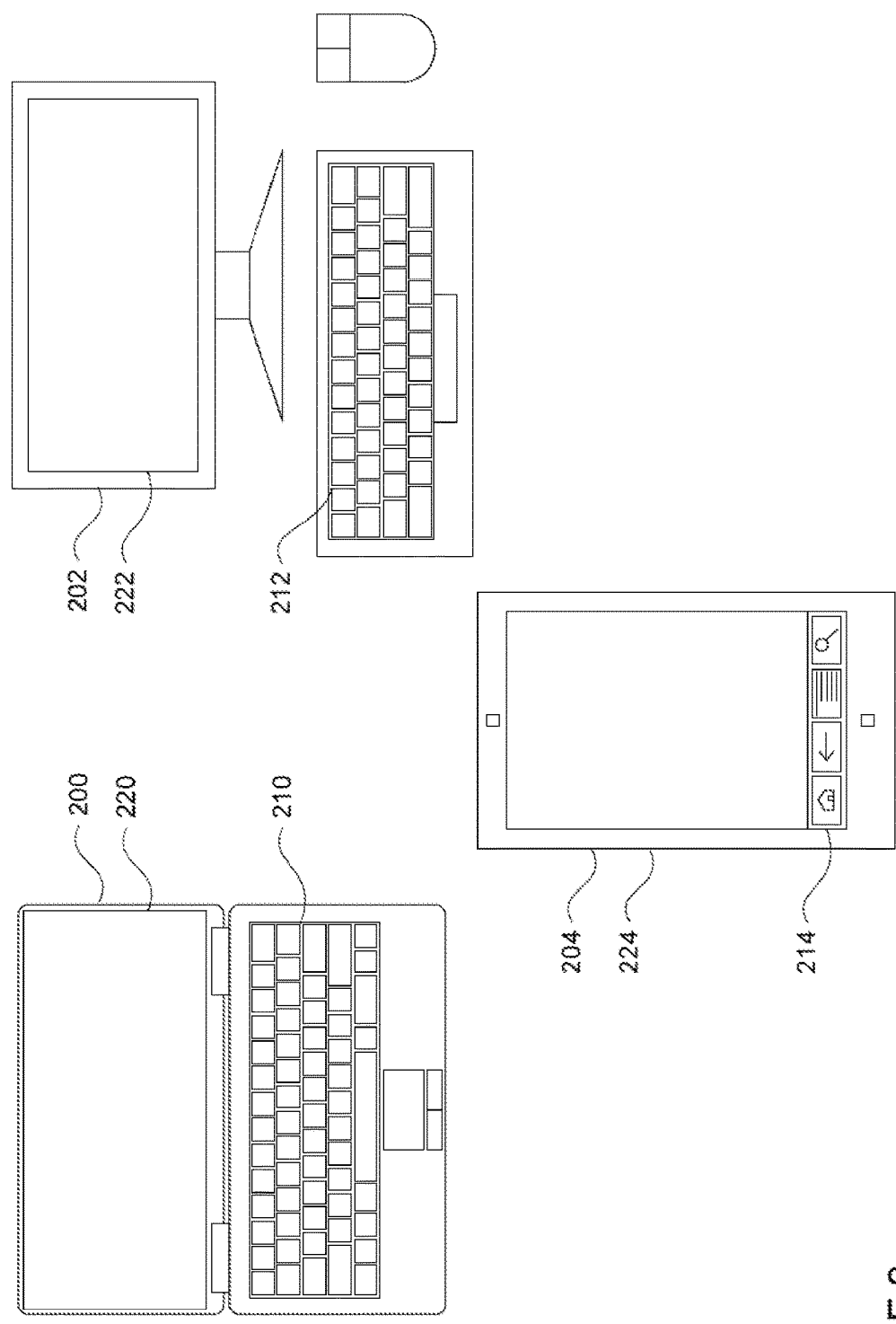
FIG. 2 is examples of devices in accordance with aspects of the disclosure.

FIG. 2 is examples of devices in accordance with aspects of the disclosure. In this example, devices 200, 202, and 204 comprise a laptop computer, a desktop computer, and a mobile phone, respectively. The keys accordance with the disclosure may also be used in conjunction with other devices which include buttons or keyboards, such as personal digital assistants, tablet PCs, netbooks, laptop computers, desktop computers, e-book readers, etc.

Figure 3:
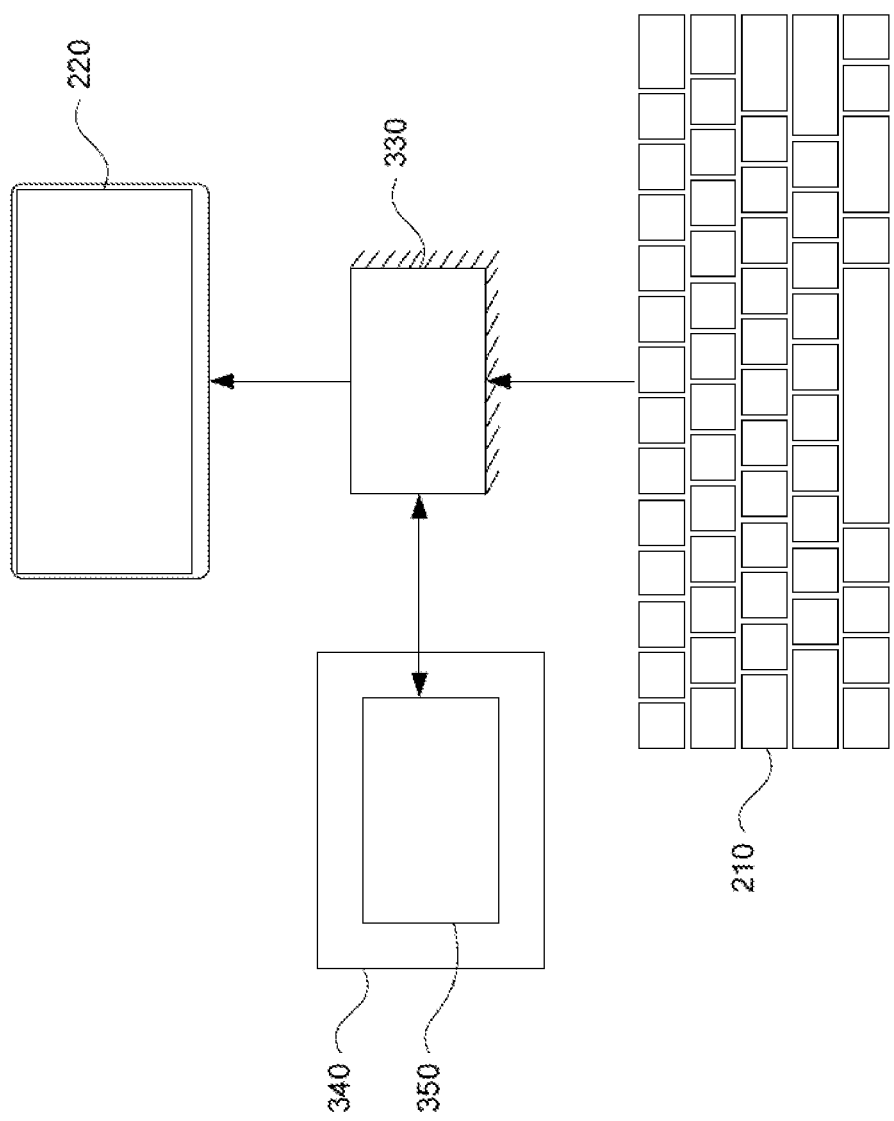
FIG. 3 is a data flow diagram of a device in accordance with aspects of the disclosure.

As shown in FIG. 3, each of the devices of FIGURE may contain a processor 330, memory 340, and other components typically present in general purpose computers. The processor 330 may be any conventional processor, such as commercially available CPUs. Alternatively, the processor may be a dedicated device such as an ASIC or other hardware-based processor. The memory 340 may store information accessible by processor, including instructions 350 that may be executed by the processor.

Returning to FIG. 2, each of these devices may include keys, such as those included in keyboard 210, keyboard 212, and set of buttons 214. These keys may include on/off switches, volume or brightness toggle buttons, keys of QWERTY or other keyboard, keys of numeric keypads, etc. These devices may also include an electronic display, such as displays 220, 222, and 224, for displaying information input by a user at the keys. For example, as shown in FIG. 3, information input at keyboard 210 is received by a processor 330. The processor 330 may then display the input on display 220 according to the instructions 340 stored in the memory 350.

Figure 4:
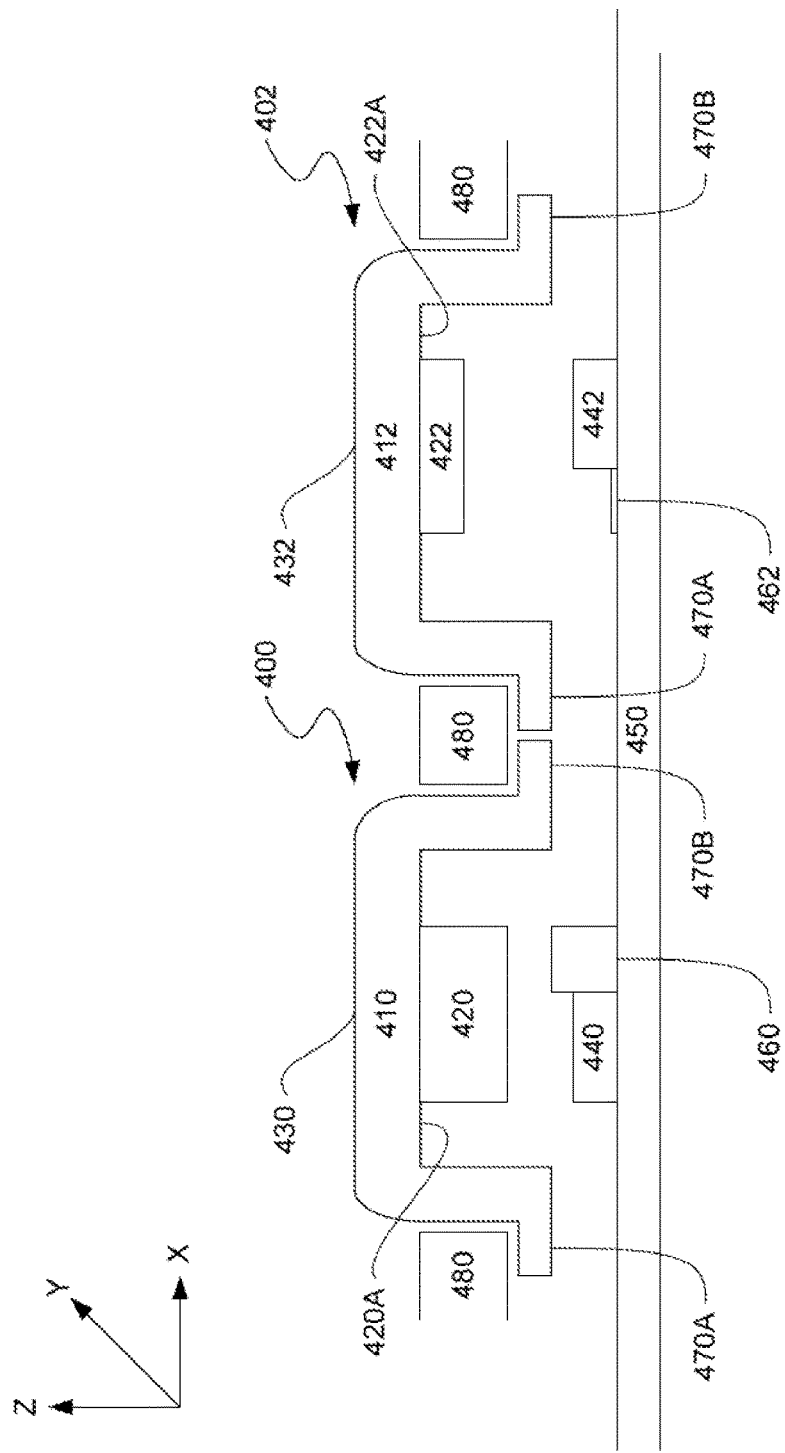
FIG. 4 is a cross-sectional side view of keys of a device in accordance with aspects of the disclosure.

FIG. 4 is a cross-sectional side view of a pair of keys 400, 402 in a device such as devices 200, 202, or 204. In this example, keys 400 and 402 are shown in the initial or rest position (they are not being pressed by a user). Each key includes a key cap 410, 412 and a magnet 420, 422. These magnets 420, 422 are mounted on surfaces 420A, 422A of the keycaps below (in the negative z-direction) and opposite of the respective contact surfaces 430, 432. Below each key 400, 402, is a second magnet 440, 442, respectively. The keys are located over a circuit board or flexible printed circuit 450 which is connected to processor 330 (see FIG. 3). Each key may be associated with a switch or a sensor that provides information to the processor 330 via the circuit board. In the example of key 400, a mechanical switch 460 is mounted on the circuit board. In the example of key 402, a magnetic field sensor 462, such as a Hall-effect magnetic sensor, is mounted on the circuit board.

Each key is associated with a magnet pair. For example, key 400 is associated with magnet pair 420, 440, while key 402 is associated with magnet pair 422, 442. In this example, each magnetic pair is arranged such that similar poles are oriented towards one another (North-North or South-South). In this example, the magnets repel one another to force the keycaps 410, 412 away from the circuit board 450.

In order to keep the keys from falling off of the device, the keys may include flanges constrained by webbing. For example, each of keys 400 and 402 may include a set of flanges 470A, 470B and 472A, 472B, respectively. The flanges are located below and extend away from the contact surfaces 430 and 432. Each flange is located below webbing 480 and configured to be constrained in the z-direction by the webbing. The webbing may include plastics (for example, polycarbonates ("PC"), Acrylonitrile butadiene styrene ("ABS"), PC and ABS blends, nylon, etc.), metals (for example, aluminum, steel, stainless steel, magnesium, etc.), as well as other materials (for example, carbon fiber, ceramics, etc.). The webbing may be located around and between the keys at the outer surface of the device. Webbing 480 is also shown in the devices of FIG. 2.

Figure 5:
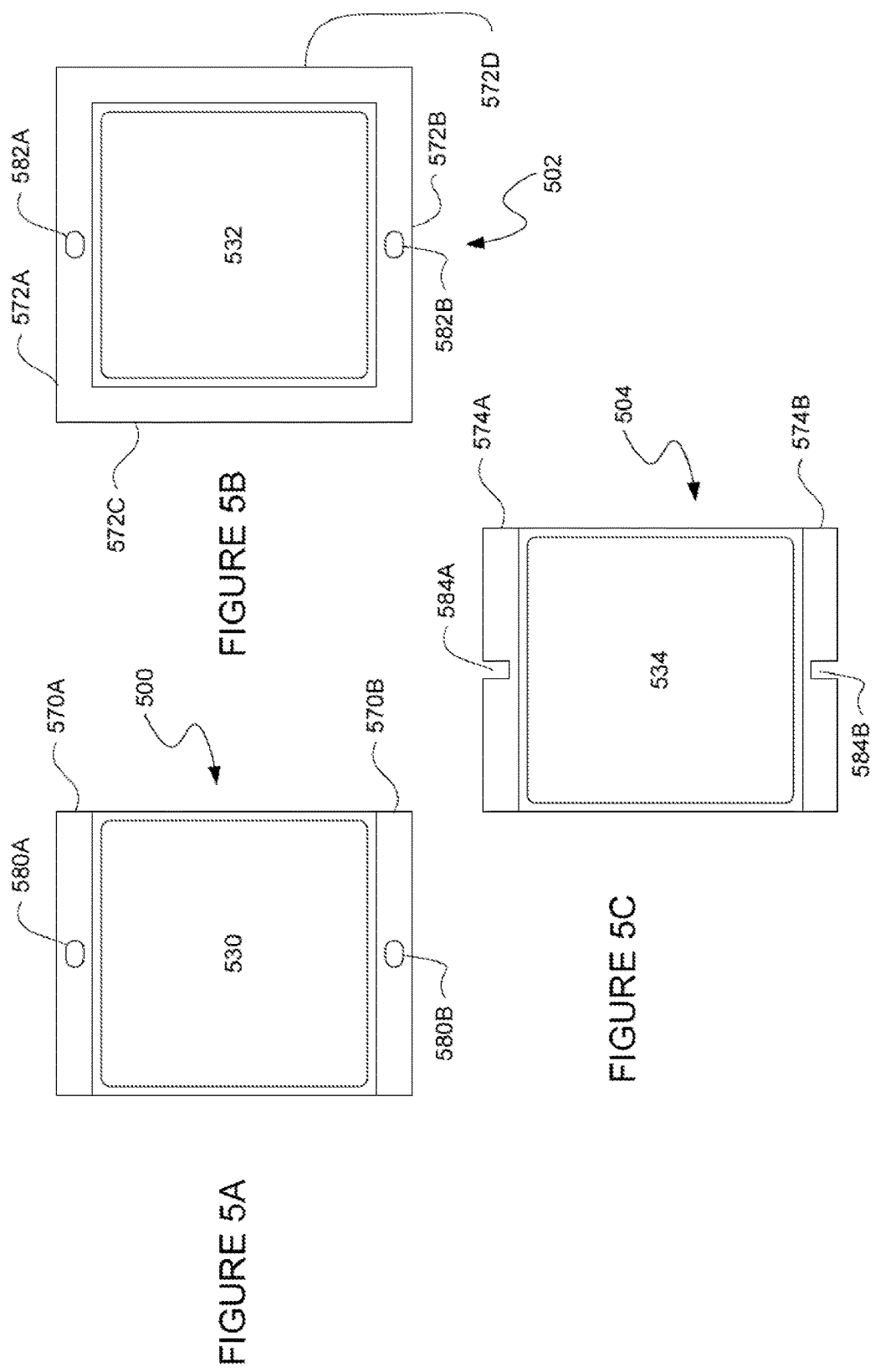
FIGS. 5A-C are top down view of keys in accordance with aspects of the disclosure.

The flanges may have different arrangements. For example, FIGS. 5A and 5B depict a top down views of two keys, 500, 502 having flanges. Keys 500 and 502 may be used in the same or different devices. In this regard, a device may include a plurality of keys similar to key 500 and/or key 502. In the example of FIG. 5A, key 500 has a keycap 510 including a set of two flanges 570A, 570B below and extending away from the contact surface 530. In the example of FIG. 5B, key 502 has a keycap 512 including a set of four flanges 570A, 570B, 570C, 570D below and extending away from the contact surface 532. The number and configuration of the flanges may be determined by the configuration of the device. For example, keys having a contact area of size A that include only two flanges may take up less area than keys having a contact area of size A that include four flanges.

To keep the keycap from moving laterally, the flanges may be constrained by rails. For example, FIGS. 5A-5C and 6 include examples of keys in which rails would pass through the flanges. FIGS. 7A-7C and 8 include examples of keys for which rails would be arranged adjacent to the flanges.

Returning to FIG. 5A, key 500 includes a pair of holes 580A and 580B, through the flanges 570A and 570B. Key 502 of FIG. 5B includes a pair of holes 582A and 582B, through the flanges 572A and 572B. FIG. 5C depicts key 504 having a pair of slots 584A and 584B, through the flanges 574A and 574B. In each of these examples, the pairs or holes and slots are located directly opposite one another in opposing pairs of flanges, though other arrangements may also be used. For example, a slot may be arranged opposite of a hole. In another example, holes and/or slots may be offset from one another in opposing flanges.

Figure 6:
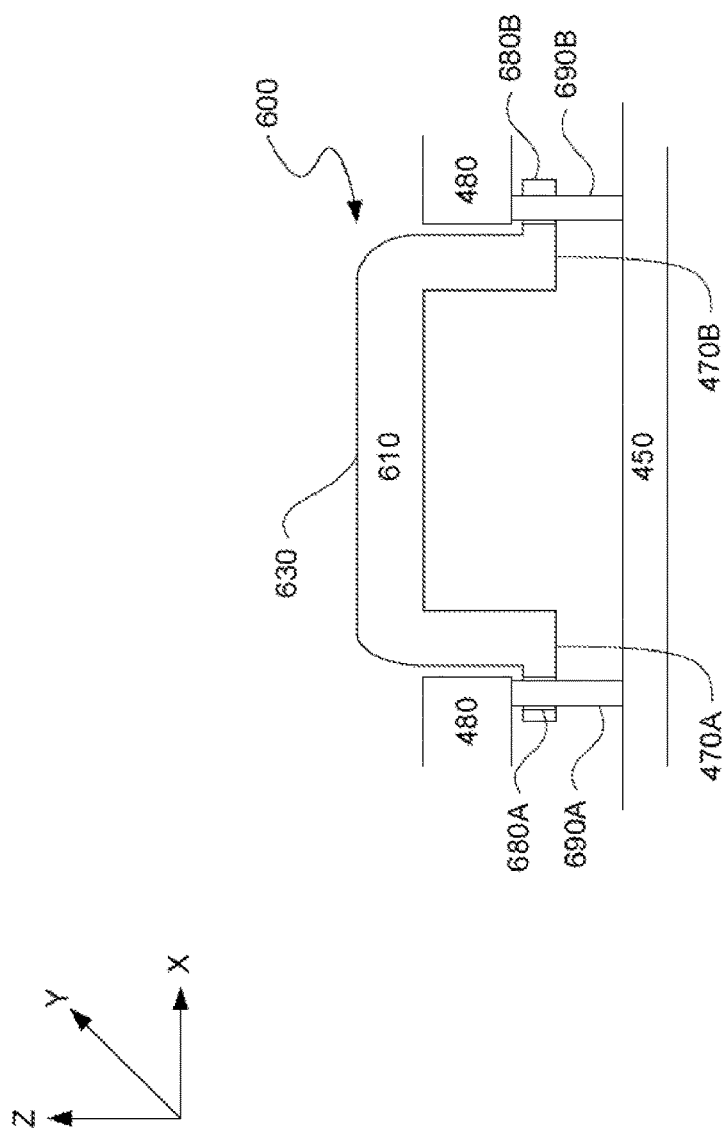
FIG. 6 is a cross-sectional side view of a key of a device in accordance with aspects of the disclosure.

FIG. 6 is a cross-sectional side view of an example key 600 including a keycap 610 having a hole 680A in a first flange 670A and a slot 680B in a second flange 670B. This example also depicts two rails 690A and 690B. Rail 690A extends between the circuit board 450 and the webbing 480 and passing through the hole 680A in the first flange 670A. A pair of holes and rails through opposing flanges may prevent the keycap from moving laterally (in the x or y-direction). Rail 690A extends between the circuit board 450 and the webbing 480 and passing through the slot 680A in the second flange 670B. A pair of slots and rails through opposing flanges may prevent the keycap from moving laterally (in the x or y-direction).

Figure 7:
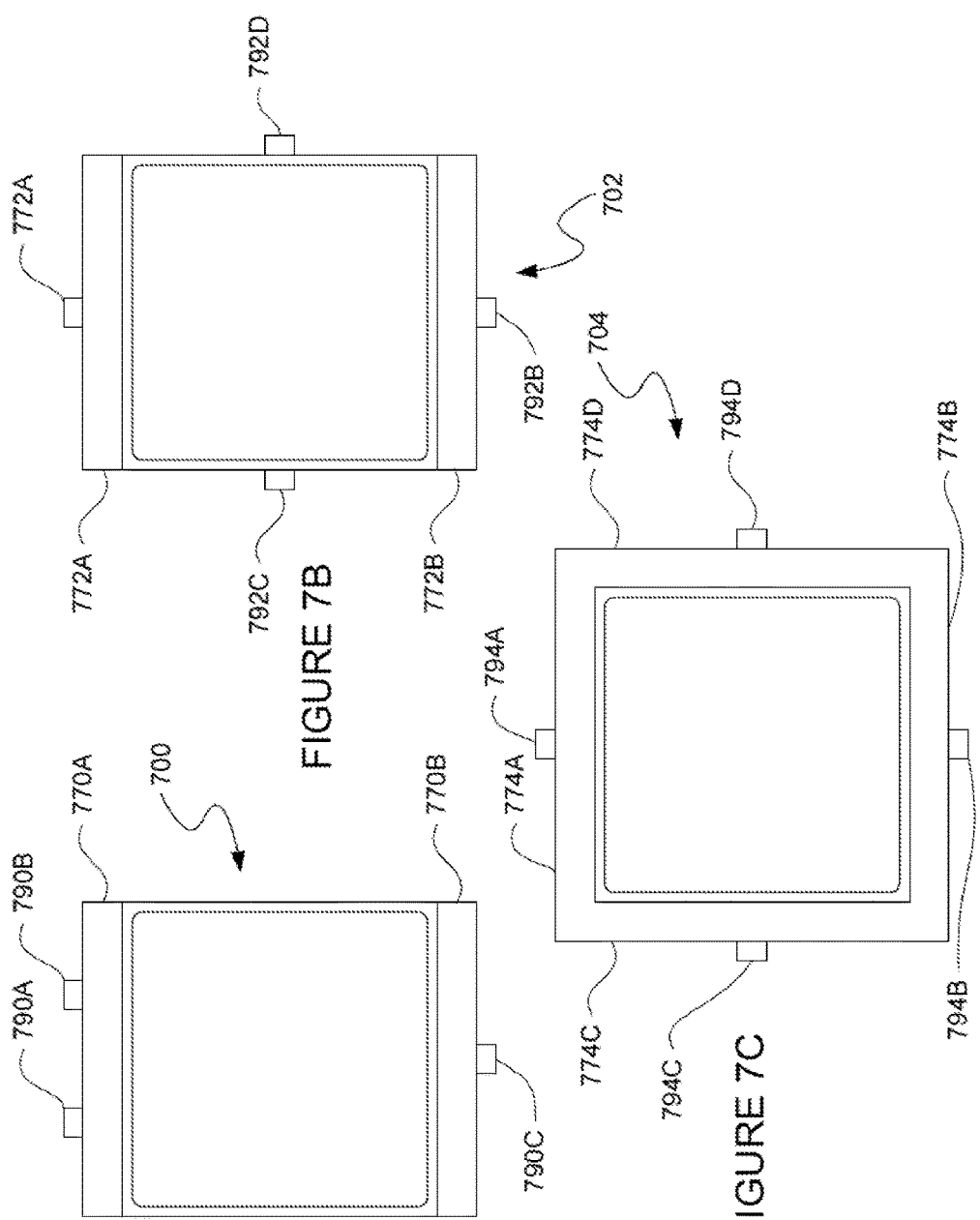
FIGS. 7A-C are top down view of keys in accordance with aspects of the disclosure.
Figure 8:
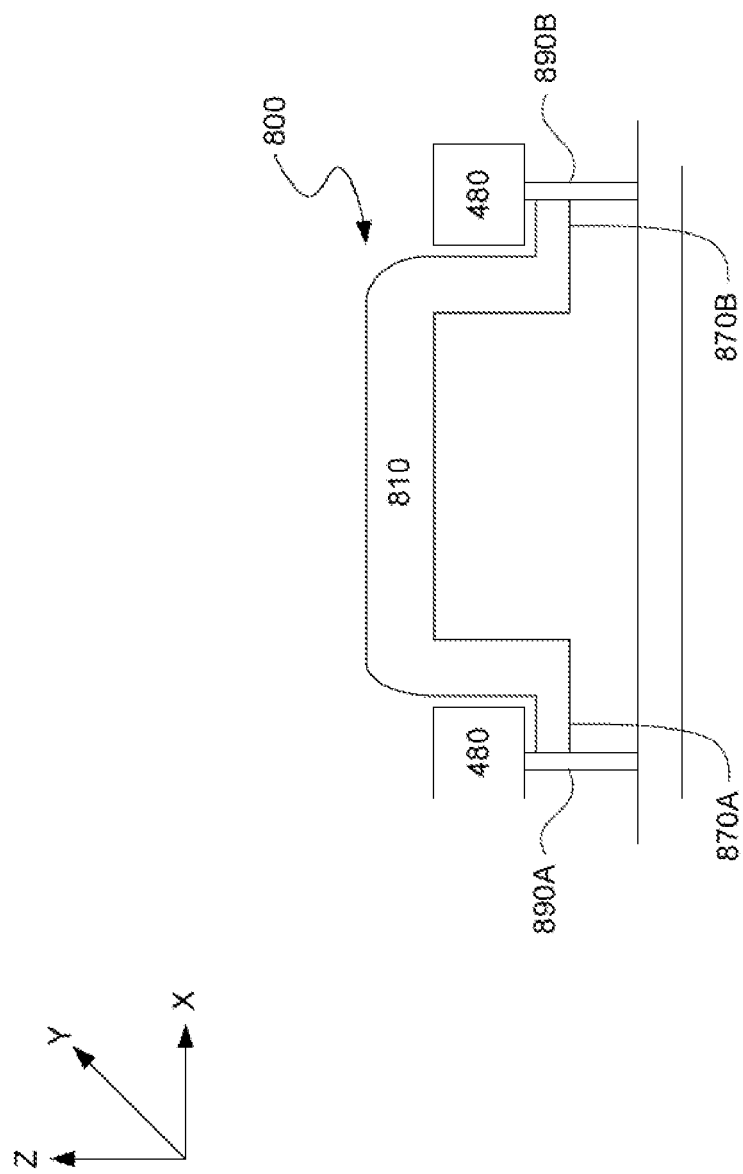
FIG. 8 is a cross-sectional side view of a key of a device in accordance with aspects of the disclosure.

FIGS. 7A-7C examples of keys 700, 702, and 704. Each key is associated with a set of flanges 770A-B, 772A-B, and 774A-D. The examples each include a set of rails arranged adjacent to the flanges. For example, FIG. 7A includes a set of three rails 790A-C arranged along opposite flanges 770A-B. FIG. 7B includes a set of four rails 792A-D. Rails 792A-B are arranged along opposite flanges 772A-B while flanges 772C-D are arranged along the outer edges of the keycap (on the sides which do not include flanges). FIG. 7B in another example including a set of four rails 794A-D. Rails 794A-B are arranged along opposite flanges 774A-B while rails 794C-D are arranged along opposite flanges 774C-D. Each set of rails of the examples of FIGS. 7A-C is configured to prevent the keys from moving laterally (in the x or y-directions). For example, FIG. 8 is a cross-sectional side view of an example key 800 including a keycap 810 having a pair of opposing flanges 870A and 870B. This example also depicts two rails 890A and 890B along each of the flanges.

Figure 9:
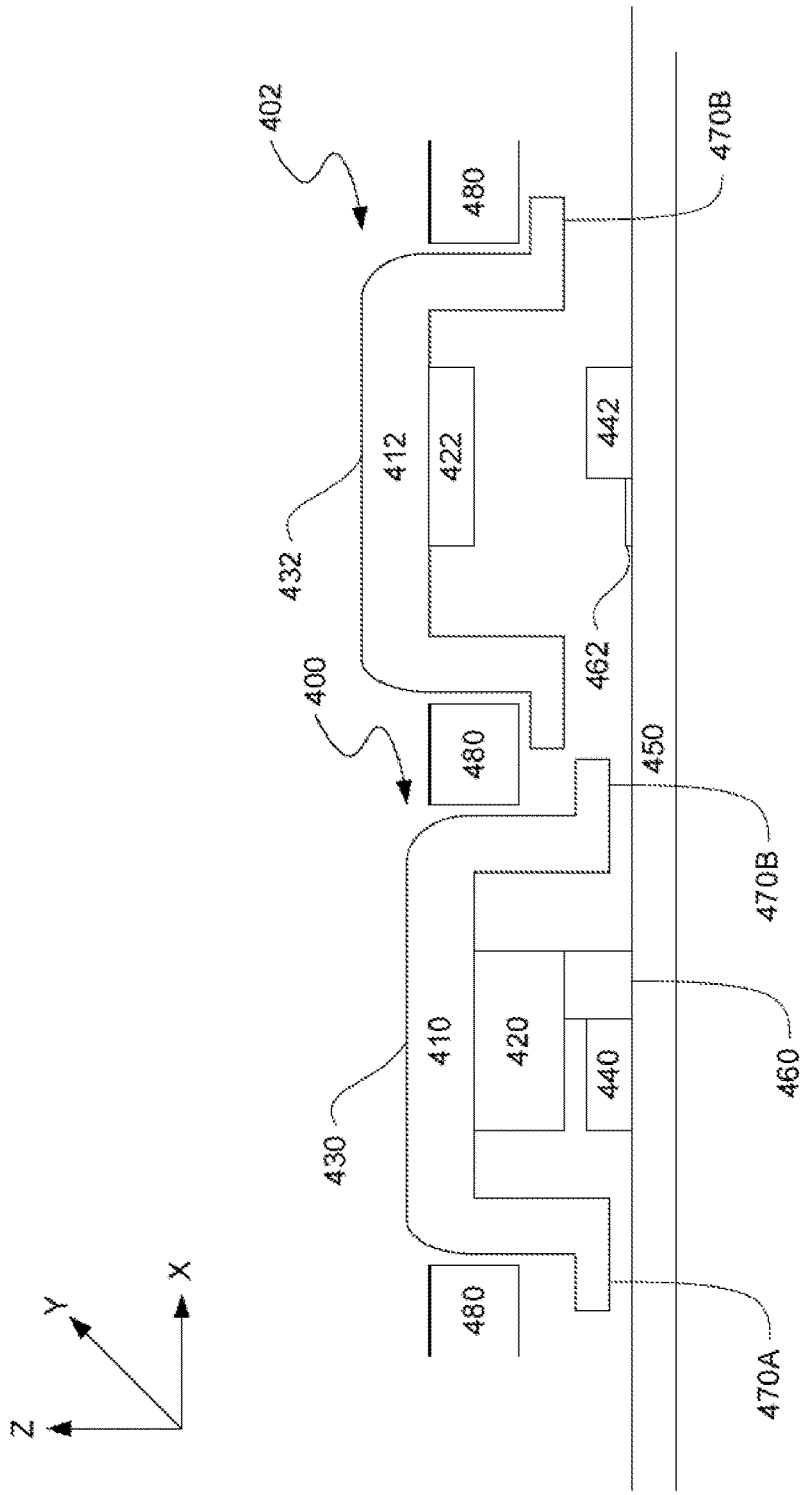
FIG. 9 is another cross-sectional side view of keys of a device in accordance with aspects of the disclosure.
Figure 10:
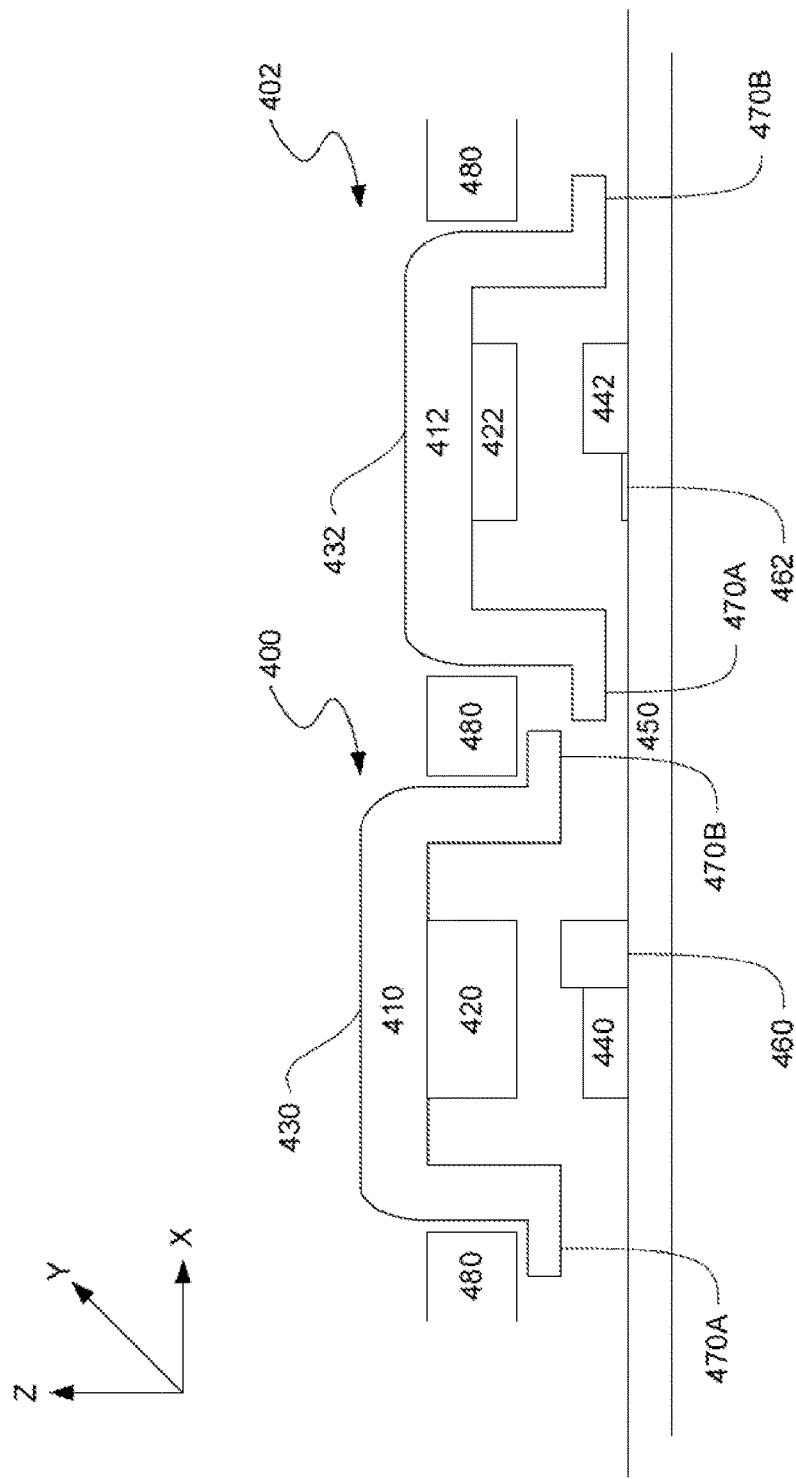
FIG. 10 is a further cross-sectional side view of keys of a device in accordance with aspects of the disclosure.

FIGS. 9 and 10 are examples of the keys of FIG. 4 being pressed by a user. For example, FIG. 9 depicts key 400 where keycap 410 is being pressed in the negative z-direction. In this example, the force of a person's finger on the contact surface 430 of the key is sufficient to force the magnets 420 and 440 towards one another. The flanges also move in the negative z-direction towards the circuit board 450. Eventually, as shown in FIG. 9, the magnet 420 contacts switch 460. As switch 460 is a mechanical switch, this contact causes the processor 330 (via circuit board 450) to determine that the key has been pressed. As noted above, a set of rails (see FIGS. 6 and 8) may keep the keycap from moving laterally.

When the force on the keycap is removed (the user is no longer pressing on the keycap), the magnets again repel one another. This repelling action acts as a spring, forcing the flanges of the keycap back towards the initial or rest position against the webbing (see FIG. 4). By using the magnets to replicate the spring force of a typical key, the space previously occupied by the rubber dome may be used for other electrical or mechanical components. Removal of the rubber dome may also reduce the distance needed to be traveled by the keycap in order for a user's pressing on a contact surface of a key to register. Thus, the volume of space required for the keys may be reduced. These features may be especially beneficial for configuring keys for very thin devices.

FIG. 10 depicts key 402 where keycap 412 is being pressed in the negative z-direction. In this example, the force of a person's finger on the contact surface 432 of the key is sufficient to force the magnets 422 and 442 towards one another. The flanges also move in the negative z-direction towards the circuit board 450. Unlike the example of key 400 shown in FIG. 10, key 402 need not contact a switch. Rather, the magnetic sensor may detect the change in the magnetic field. This information may be sent to the processor 330 (via circuit board 450) to determine whether the key has been pressed. As noted above, a set of rails (see FIGS. 6 and 8) may keep the keycap from moving laterally. When the force on the keycap is removed the magnets again repel one another as described above.

Figure 11:
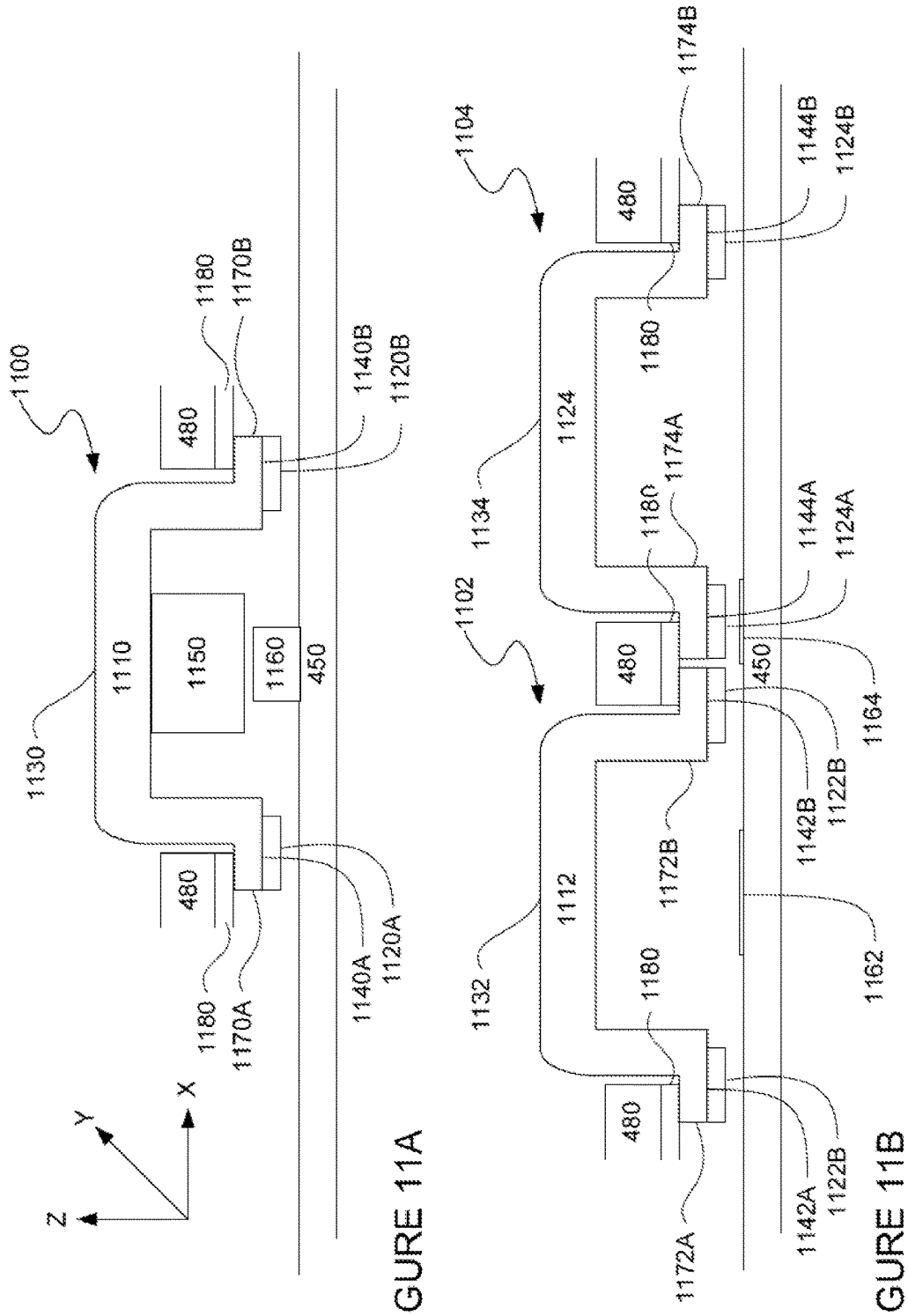
FIGS. 11A-B are cross-sectional side views of keys of a device in accordance with aspects of the disclosure.

Rather than being mounded on the underside of the key cap, magnets may be mounted on the flanges. In one example, a bottom surface of two or more of the flanges may include a magnet. FIGS. 11A and 11B are cross-sectional side views of keys 1100, 1102, and 1104 each having magnets mounted on flanges. Keys 1100, 1102, and 1104 may be used in the same or different devices.

In the example of FIG. 11A, key 1100 has a keycap 1110 including a set of two flanges 1170A-B below and extending away from the contact surface 1130. Magnets 1120A-B are mounted on the bottom surfaces 1140A-B of the flanges 1170A-B. Key 1100 also include a switch contact surface 1150 below the contact surface 1130. In the example of FIG. 11A, a mechanical switch 1160 is mounted below the switch contact surface 1150 on the circuit board 450.

Key 1102 of FIG. 11B has a keycap 1112 including a set of two flanges 1172A-B below and extending away from the contact surface 1132. Magnets 1122A-B are mounted on the bottom surfaces 1142A-B of the flanges 1172A-B. Key 1104 of has a keycap 1114 including a set of two flanges 1174A-B below and extending away from the contact surface 1134. Magnets 1124A-B are mounted on the bottom surfaces 1144A-B of the flanges 1174A-B. In these examples, a magnetic field sensor 1162, 1164, such as a Hall-effect magnetic sensor, is mounted on the circuit board. Sensor 1162 is mounted in the middle of the keycap 1112, while sensor 1164 is mounted below only one of the flanges 1174A. The location of the sensor may be dictated by the sensitivity of the sensor. For example, sensor 1164 may be less sensitive to changes in magnetic fields than sensor 1162.

In this example, the webbing may also include a magnet or magnetic plate. For example, individual magnets may be mounted to the webbing or webbing 480 may include a ferrous plate 1180. In this example, the ferrous plate may be mounted to the plate (as shown in FIGS. 11A-11C) or the webbing (and, in some examples, all or some portion of the device associated with the keys, buttons, etc.) may be made of a ferrous material, for example, steel. In this example, there may be no need to additional ferrous plate under the webbing. There may be some advantage to using webbing including a ferrous plate with the potential cost savings from using fewer magnets. The plate (or individual magnets) and the magnets of the flanges may be arranged such that opposite poles are oriented towards one another (North-South or South-North). This causes the ferrous plate 1180 (or individual magnets mounted on the webbing) and the magnets mounted on the flanges to attract one another and hold the keycap to the ferrous plate or individual magnets webbing. Thus, in the examples of FIGS. 11A-C, keys 1100, 1102, and 1104 are shown in the initial or rest position (they are not being pressed by a user).

Figure 12:
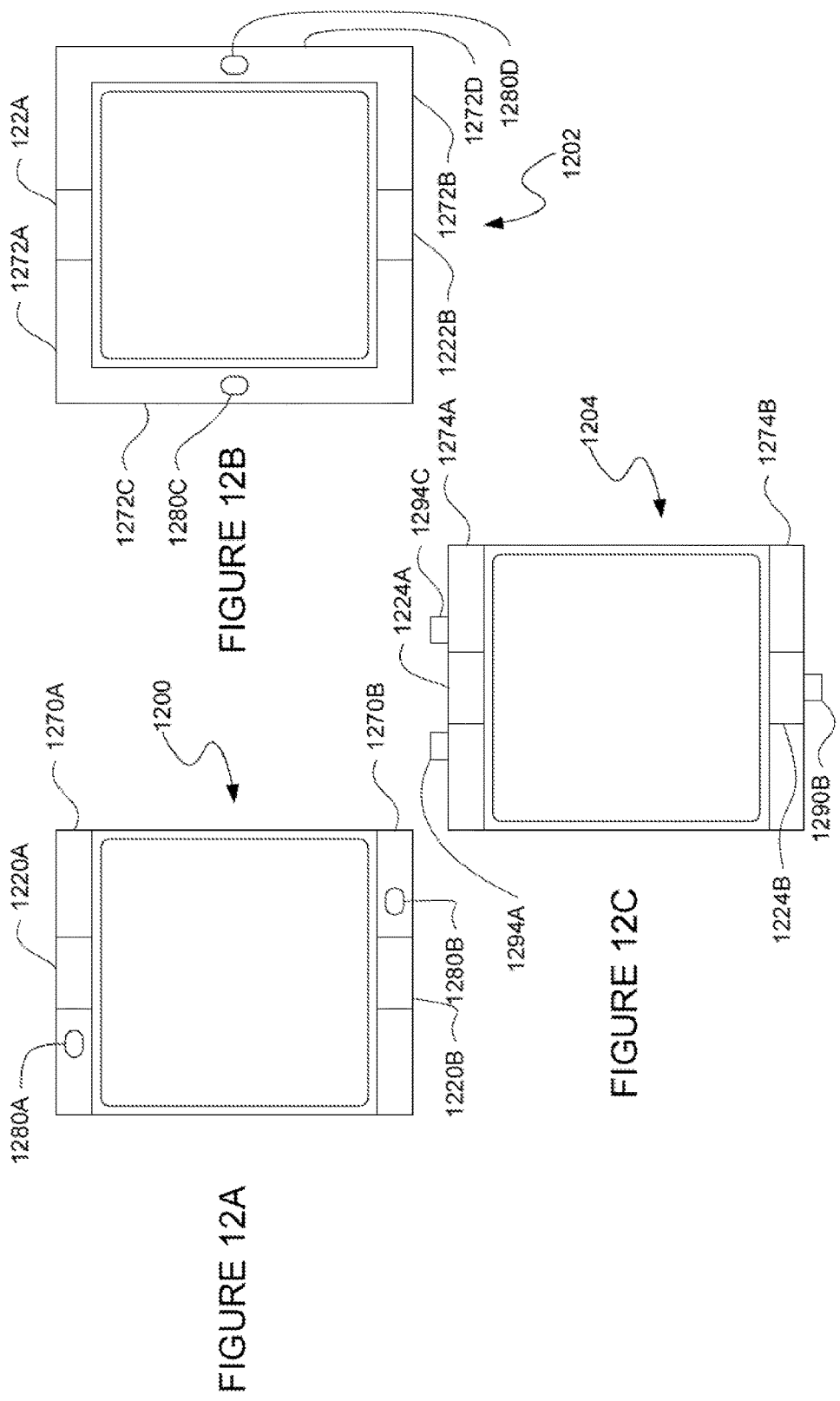
FIGS. 12A-C are additional cross-sectional side views of keys of a device in accordance with aspects of the disclosure.

The magnets mounted on the flanges may be arranged to balance the magnetic forces between the webbing and the key cap. In addition, as with the keys described above, to keep the keycap from moving laterally, the flanges may be constrained by rails. For example, FIGS. 12A-C depicts three examples of keys 1200, 1202, and 1204, each having different configurations of magnets and rails. Key 1200 includes a pair of magnets 1220A-B in a pair of opposing flanges 1270A-B. The pair of opposing flanges also includes offset holes 1280A-B for receiving rails (see FIG. 6). Key 1202 includes a pair of magnets 1222A-B in a first pair of opposing flanges 1272A-B, and a pair of corresponding holes 1280A-B for receiving rails in a second set pair of opposing flanges 1272C-D (see FIG. 6). Key 1204 includes a pair of magnets 1224A-B in a pair of opposing flanges 1274A-B. Adjacent to key 1204 is a set of three rails 1294A-C. FIGS. 12A-C are merely examples, various other configurations of magnets, flanges, and rails, for example those that employ slots, may also be used.

Figure 13:
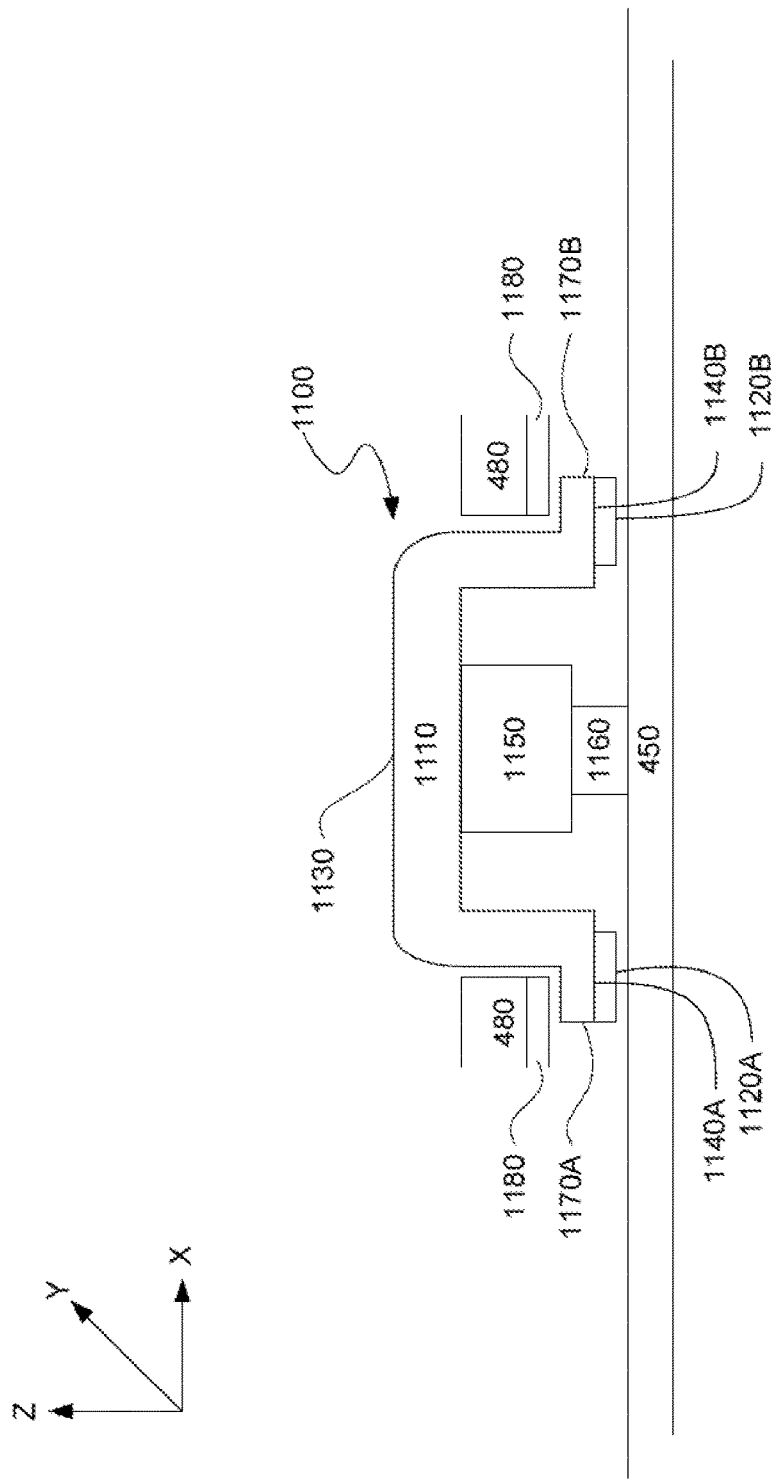
FIG. 13 is a further cross-sectional side view of keys of a device in accordance with aspects of the disclosure.
Figure 14:
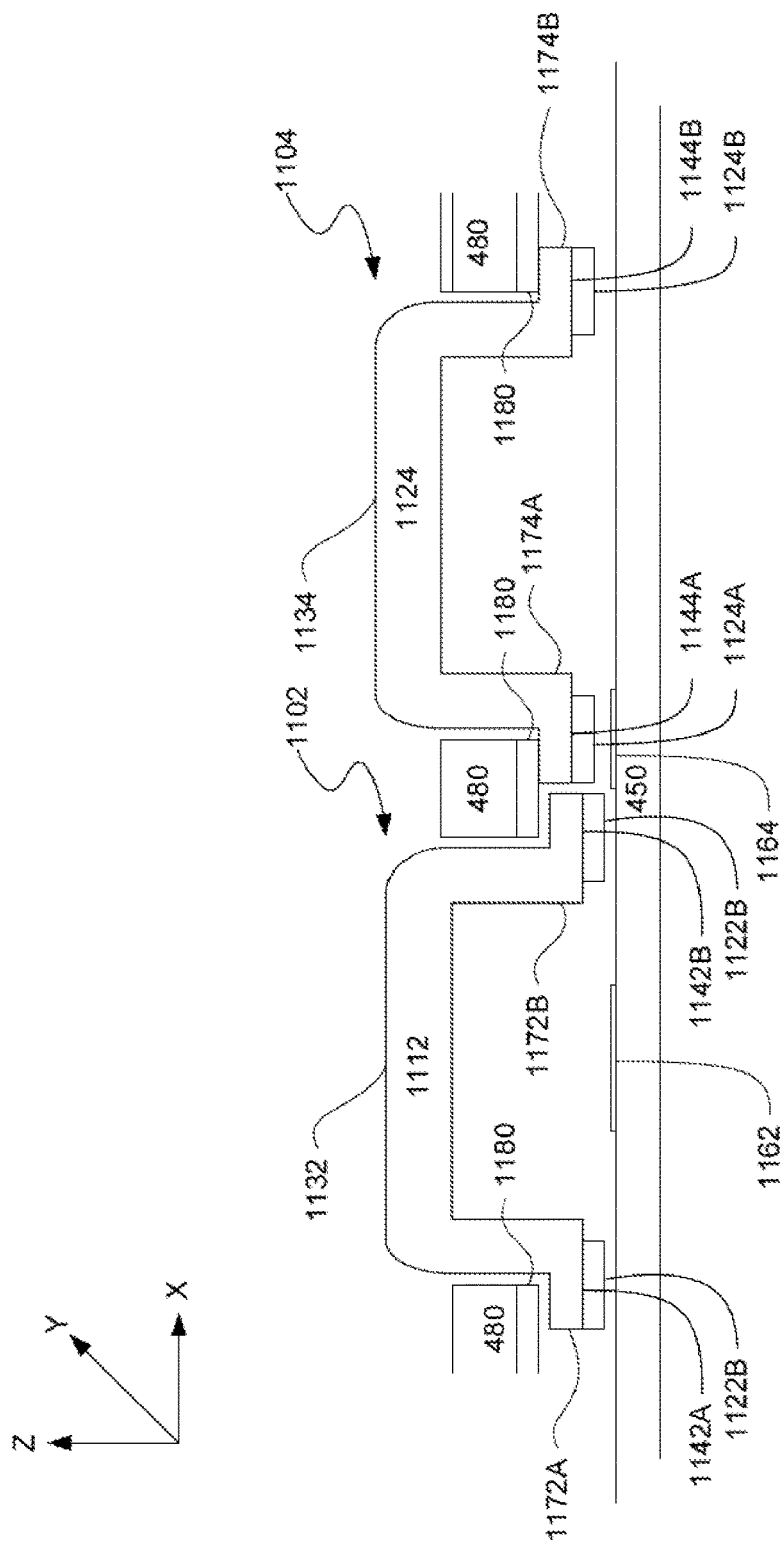
FIG. 14 is a cross-sectional side view of keys of a device in accordance with aspects of the disclosure.
Figure 15:
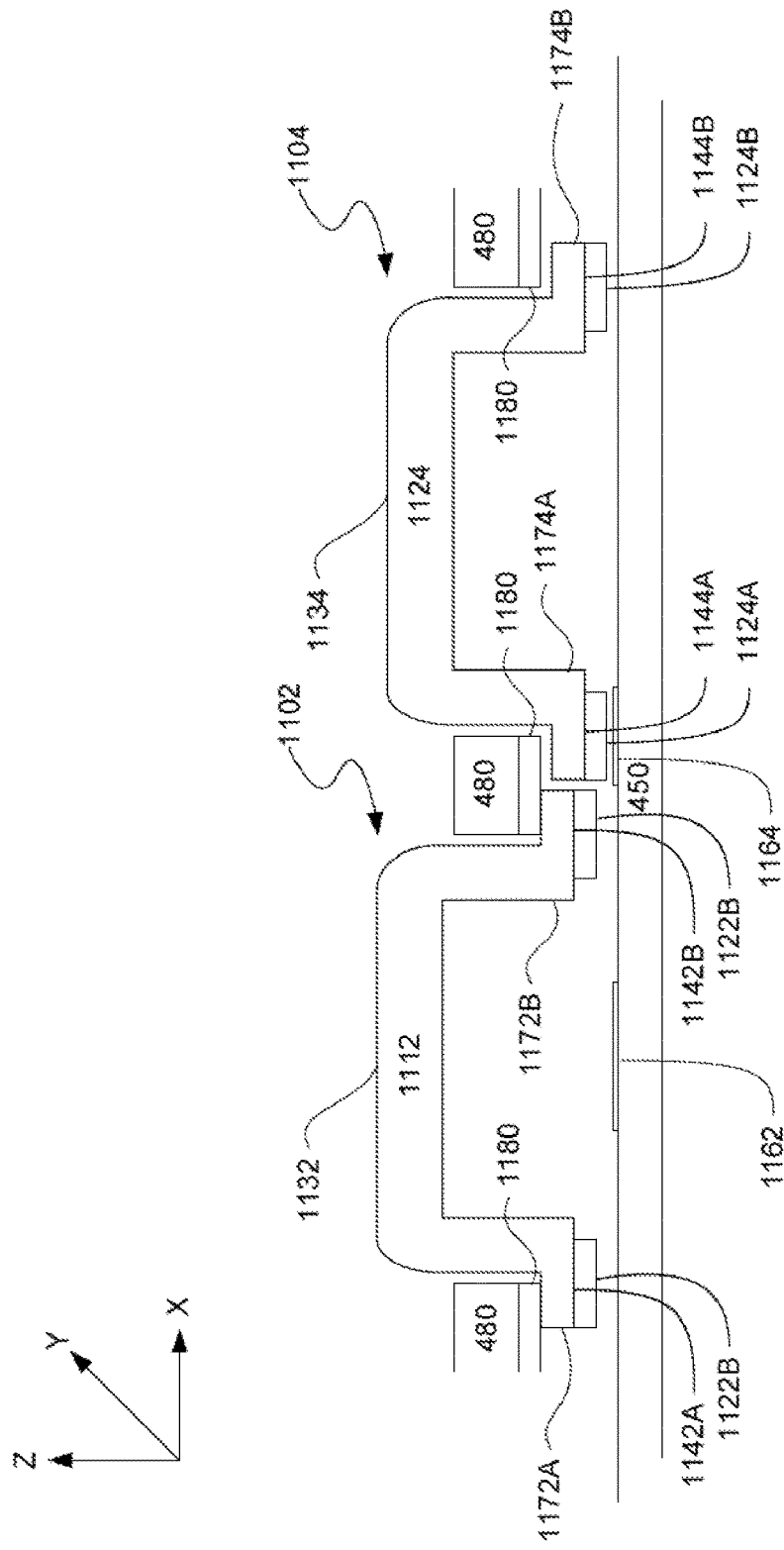
FIG. 15 is another cross-sectional side view of keys of a device in accordance with aspects of the disclosure.

When the keycap is pressed, the force breaks the connection between the magnets. For example, FIGS. 13-15 are each examples of keys 1102, 1104, and 1106, where each key is being pressed in the negative z-direction. In the example of FIG. 13, the force of a person's finger on the contact surface 1130 of the key is sufficient to force the magnets 1120A-B away from the plate 1180 (or the individual magnets mounted to the webbing). The flanges also move in the negative z-direction towards the circuit board 1150. Eventually, the switch contact surface 1150 contacts switch 1160. As switch 1160 is a mechanical switch, this contact causes the processor 330 (via circuit board 450) to determine that the key has been pressed. As noted above, a set of rails (see FIGS. 6 and 8) may keep the keycap from moving laterally.

When the force on the keycap is removed (the user is no longer pressing on the keycap), the magnet mounted on the flanges and ferrous plate (or the individual magnets mounted to the webbing) attract one another. This attraction force action acts as a spring, forcing the flanges of the keycap back towards the initial or rest position against the webbing (see FIG. 11A). Again, by using the magnets to replicate the spring force of a typical key, the rubber dome is not required, and thus, various other benefits, such as those described above may be achieved.

FIG. 14 depicts key 1102 where keycap 1112 is being pressed in the negative z-direction. Similarly, FIG. 15 depicts key 1104 where keycap 1114 is being pressed in the negative z-direction. In these examples, the force of a person's finger on the contact surfaces 1132 or 1134 of the keys is sufficient to force the magnets 1122A-B (FIG. 14) or 1124A-B (FIG. 15) away from the plate 1180 (or the individual magnets mounted to the webbing). The flanges also move in the negative z-direction towards the circuit board 450. Unlike the example of key 1100 shown in FIG. 13, keys 1102 and 1104 need not contact a switch. Rather, the magnetic sensors 1162 and 1164 may detect the change in the magnetic field. For example, the strength of the magnetic field detected by a Hall-effect sensor may be inversely proportional to the distance between the magnet (or ferrous plate) and the sensor. The sensor may output a digital signal to a processor (the same or different from processor 330) or other controller. The processor or other controller may be programmed to scale or shrink an output value as desired. So, if B=strength of magnetic field at a given distance, the output of the controller or processor may be M*B, where M is the sensitivity scaling factor determine by the designer (of the device, key, etc.) This information may be sent to the processor 330 (via circuit board 450). The processor 330 may then determine that a key has been pressed when the controller output is greater than another device variable. For example, if the controller output is greater than or equal to (or simply greater than) a threshold value, the processor may determine that a key has been pressed.

Using a magnetic sensor may provide a number of benefits. For example, when a magnetic sensor is used, the sensor may be calibrated to allow for the adjustments in the sensitivity of the keys. For example, the sensitivity scaling factor and/or threshold value may be adjusted. In other words, the distance the key must be moved in the negative z-direction may be adjusted. Another advantage of a magnetic sensor is that there is no physical connection required between the keycap and the underlying structure for the switch. This volume becomes free for other electrical or mechanical components.

As noted above, a set of rails (see FIGS. 6 and 8) may keep the keycap from moving laterally. When the force on the keycap is removed the magnets of the flanges and magnetic plate (or the individual magnets mounted to the webbing) again attract one another as described above. This attraction force action acts as a spring, forcing the flanges of the keycap back towards the initial or rest position against the webbing (see FIGS. 11B-C).

Figure 16A:
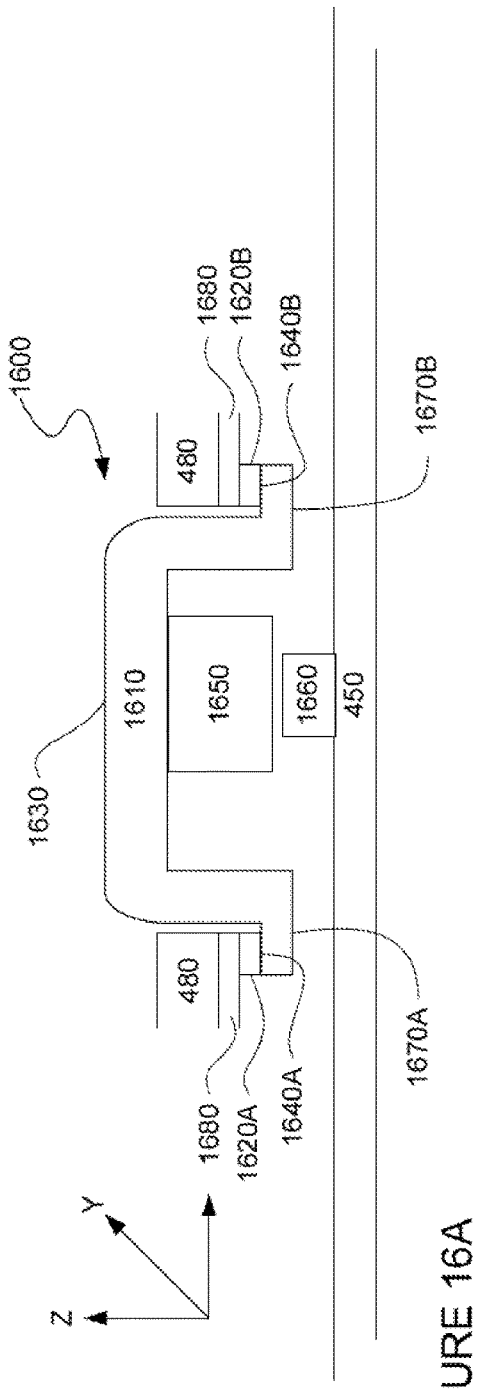
FIGS. 16A-B are cross-sectional side views of keys of a device in accordance with aspects of the disclosure.
Figure 16B:
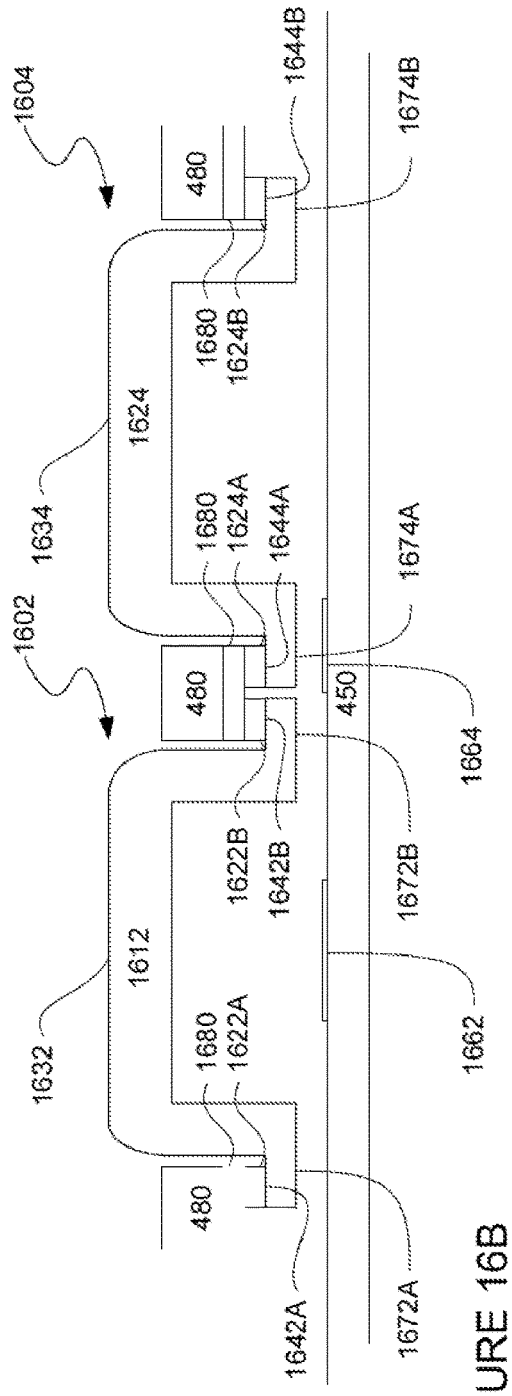

In another example, a top surface of two or more of the flanges may include a magnet. FIGS. 16A and 16B are cross-sectional side views of keys 1600, 1602, and 1604 each having magnets mounted on flanges. Keys 1600, 1602, and 1604 may be used in the same or different devices.

In the example of FIG. 16A, key 1600 has a keycap 1610 including a set of two flanges 1670A-B below and extending away from the contact surface 1630. Magnets 1620A-B are mounted on the top surfaces 1640A-B of the flanges 1670A-B. Key 1600 also include a switch contact surface 1650 below the contact surface 1630. In the example of FIG. 16A, a mechanical switch 1660 is mounted below the switch contact surface 1650 on the circuit board 450.

Key 1602 of FIG. 16B has a keycap 1612 including a set of two flanges 1672A-B below and extending away from the contact surface 1632. Magnets 1622A-B are mounted on the top surfaces 1642A-B of the flanges 1672A-B. Key 1604 of has a keycap 1614 including a set of two flanges 1674A-B below and extending away from the contact surface 1634. Magnets 1624A-B are mounted on the top surfaces 1644A-B of the flanges 1674A-B. In these examples, a magnetic field sensor 1662, 1664, such as a Hall-effect magnetic sensor, is mounted on the circuit board. Sensor 1662 is mounted in the middle of the keycap 1612, while sensor 1664 is mounted below only one of the flanges 1674A. The location of the sensor may be dictated by the sensitivity of the sensor. For example, sensor 1664 may be less sensitive to changes in magnetic fields than sensor 1662.

As with the examples of FIGS. 11A-C, webbing 480 of FIGS. 16A-C may include a magnet or magnetic plate. For example, webbing 480 may include a ferrous plate 1680, though individual magnets may also be used. Again, the plate (or individual magnets) and the magnets of the flanges may be arranged such that opposite poles are oriented towards one another (North-South or South-North). This may cause the ferrous plate 1680 (or individual magnets mounted on the webbing) and the magnets mounted on the flanges to attract one another and hold the keycap to the ferrous plate or individual magnets mounted to the webbing. Thus, in the examples of FIGS. 16A-C, keys 1600, 1602, and 1604 are shown in the initial or rest position (they are not being pressed by a user).

As with the examples of FIGS. 12A-C, the magnets mounted on the flanges may be arranged to balance the magnetic forces between the webbing and the key cap. In addition, as with the keys described above, to keep the keycap from moving laterally, the flanges may be constrained by rails. Various other configurations of magnets, flanges, and rails may also be used.

Figure 17:
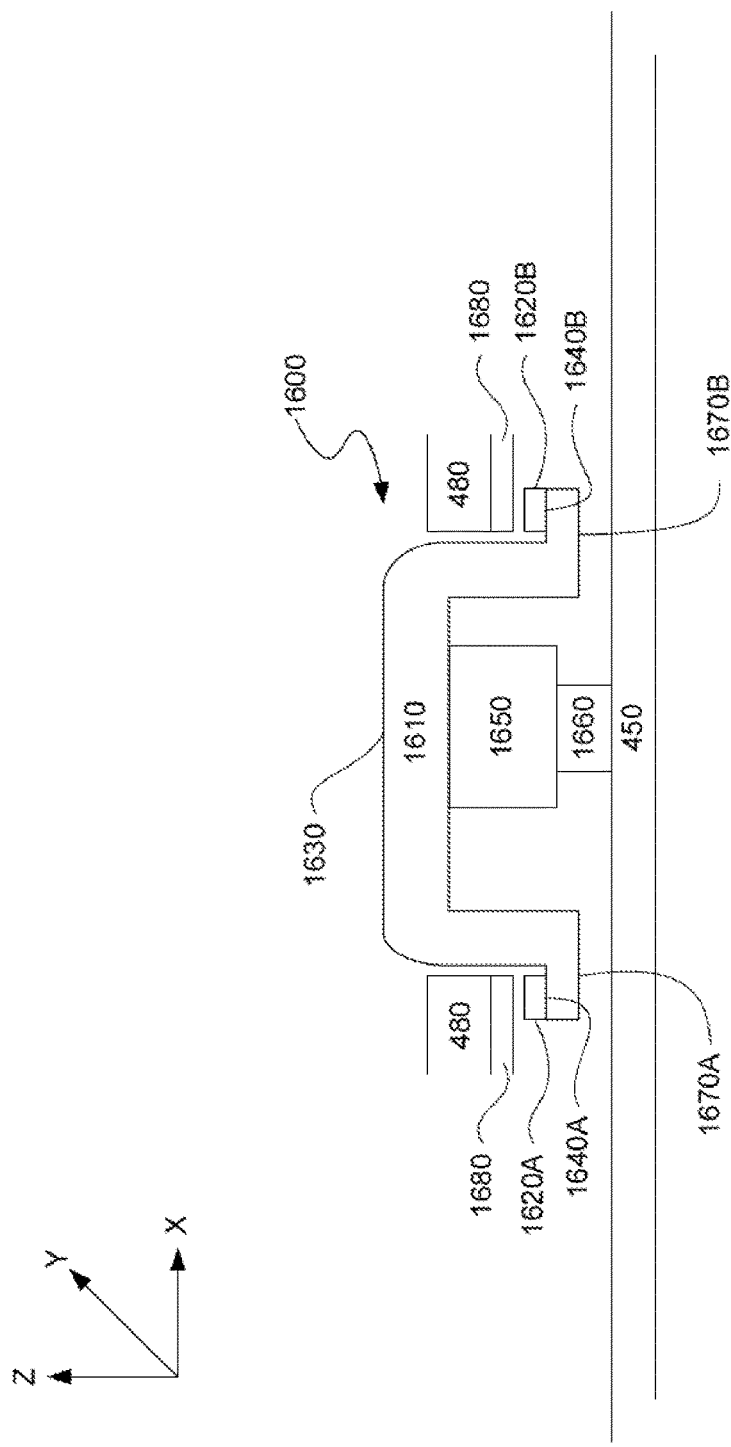
FIG. 17 is a further cross-sectional side view of keys of a device in accordance with aspects of the disclosure.
Figure 18:
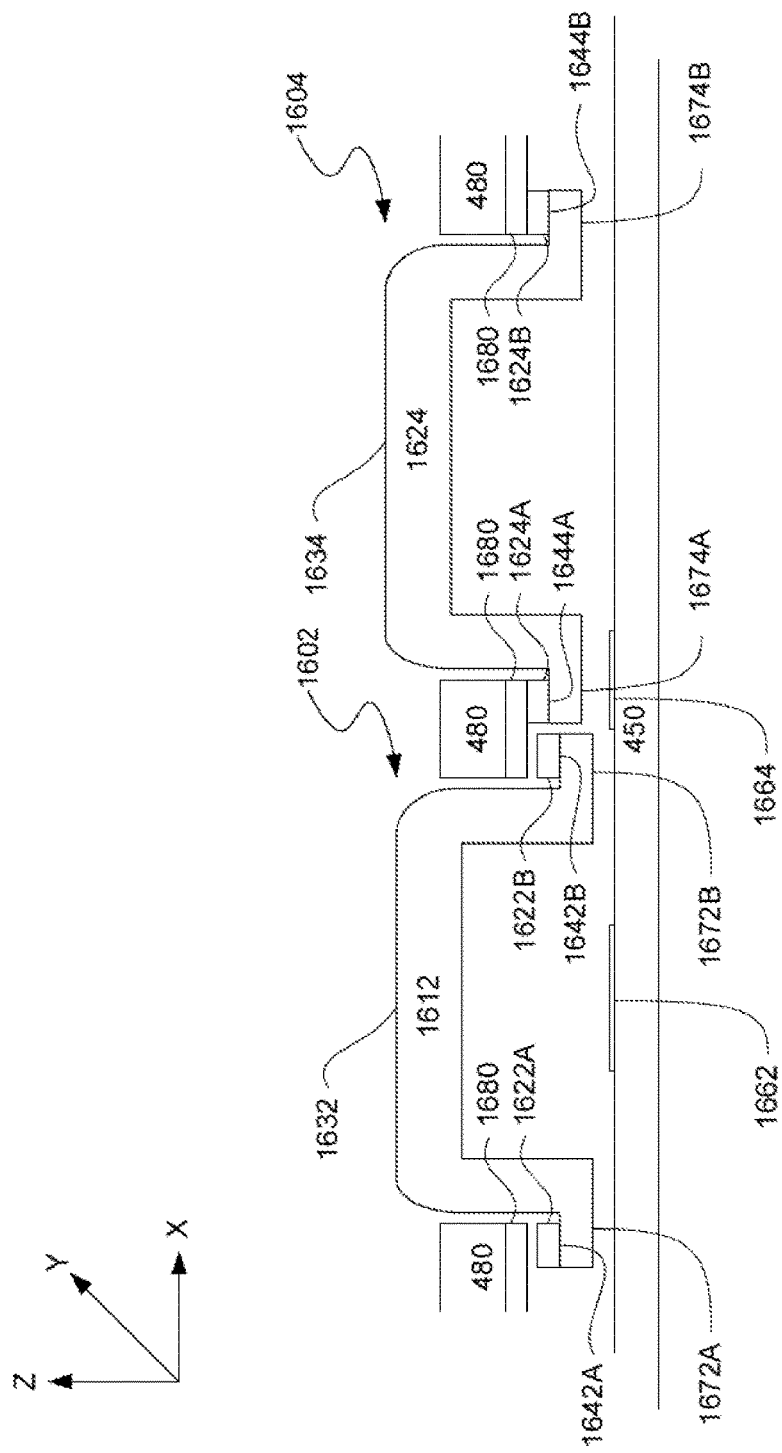
FIG. 18 is a cross-sectional side view of keys of a device in accordance with aspects of the disclosure.
Figure 19:
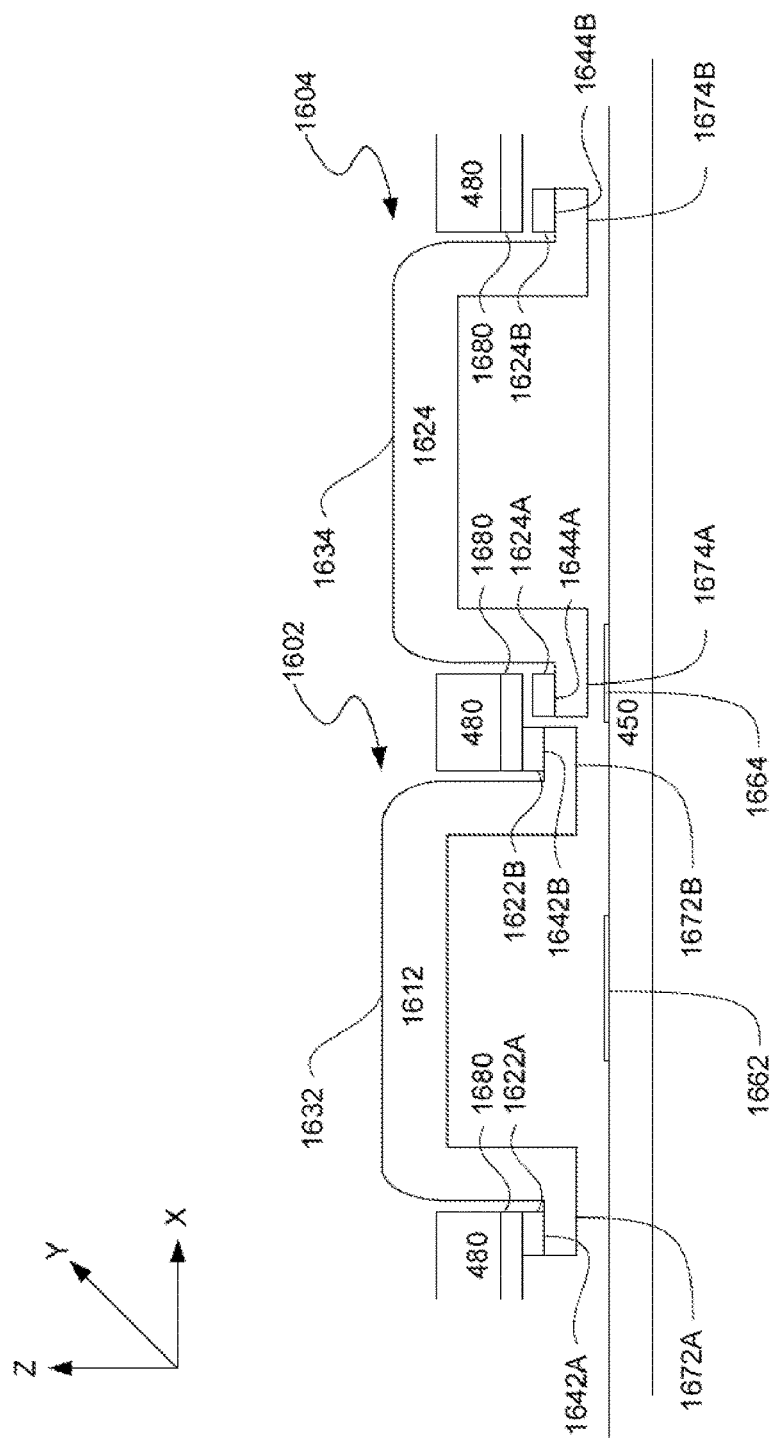
FIG. 19 is another cross-sectional side view of keys of a device in accordance with aspects of the disclosure.

Keys 1600, 1602, and 1604 may operate similarly to keys 1100, 1102, and 1104. For example, when the keycap is pressed, the force breaks the connection between the magnets. For example, FIGS. 17-19 are each examples of keys 1602, 1604, and 1606, where each key is being pressed in the negative z-direction. In the example of FIG. 13, the force of a person's finger on the contact surface 1630 of the key is sufficient to force the magnets 1620 away from the plate 1680 (or the individual magnets mounted to the webbing). The flanges also move in the negative z-direction towards the circuit board 1650. Eventually, the magnet 1620 contacts switch 1660. As switch 1660 is a mechanical switch, this contact causes the processor 330 (via circuit board 450) to determine that the key has been pressed. As noted above, a set of rails (see FIGS. 6 and 8) may keep the keycap from moving laterally.

When the force on the keycap is removed (the user is no longer pressing on the keycap), the magnet mounted on the flanges and ferrous plate (or the individual magnets mounted to the webbing) attract one another. This attraction force action acts as a spring, forcing the flanges of the keycap back towards the initial or rest position against the webbing (see FIG. 16A). Again, by using the magnets to replicate the spring force of a typical key, the rubber dome is not required, and thus, various other benefits, such as those described above may be achieved.

FIG. 18 depicts key 1602 where keycap 1612 is being pressed in the negative z-direction. Similarly, FIG. 19 depicts key 1604 where keycap 1614 is being pressed in the negative z-direction. In these examples, the force of a person's finger on the contact surfaces 1632 or 1634 of the keys is sufficient to force the magnets 1622 (FIG. 18) or 1624 (FIG. 19) away from the plate 1680 (or the individual magnets mounted to the webbing). The flanges also move in the negative z-direction towards the circuit board 450. Unlike the example of key 1600 shown in FIG. 17, keys 1602 and 1604 need not contact a switch. Rather, the magnetic sensors 1662 and 1664 may detect the change in the magnetic field. This information may be sent to the processor 330 (via circuit board 450) to determine whether the key has been pressed as described above. As noted above, a set of rails (see FIGS. 6 and 8) may keep the keycap from moving laterally. When the force on the keycap is removed the magnets again attract one another as described above. This attraction force action acts as a spring, forcing the flanges of the keycap back towards the initial or rest position against the webbing (see FIGS. 16B-C).

As these and other variations and combinations of the features discussed above can be utilized without departing from the subject matter defined by the claims, the foregoing description of the embodiments should be taken by way of illustration rather than by way of limitation of the subject matter defined by the claims. It will also be understood that the provision of the examples disclosed herein (as well as clauses phrased as "such as," "including" and the like) should not be interpreted as limiting the claimed subject matter to the specific examples; rather, the examples are intended to illustrate only one of many possible embodiments. Further, the same reference numbers in different drawings may identify the same or similar elements.

The invention claimed is:

1. A device comprising:
   a key for inputting information in response to input by a user, the key including:
      a keycap having a contact surface for receiving user input;
      a set of flanges arranged on the keycap, such that a flange of the set of flanges extends, at least partially, horizontally away from the contact surface;
      a magnet mounted to the flange of the set of flanges arranged on the keycap;
   a circuit board for providing information to a processor, the information indicating whether the contact surface has been pressed;
   an input apparatus associated with the circuit board, the input apparatus being configured to generate the information; and
   webbing adjacent to the set of flanges, the webbing configured to prevent the keycap from being removed from the device.

2. The device of claim 1, wherein the flange of the set of flanges includes a surface oriented towards the webbing, and wherein the magnet is mounted to the flange surface.

3. The device of claim 2, further including a magnetic plate mounted on a surface of the webbing oriented towards the circuit board.

4. The device of claim 3, wherein the magnet is mounted such that opposing poles of the magnetic plate and the magnet are oriented towards one another, and the magnetic plate and the magnet attract one another.

5. The device of claim 3, wherein the device is configured such that a rest position of the key includes the magnet contacting the magnetic plate.

6. The device of claim 2, further including a second magnet mounted on a surface of the webbing oriented towards the circuit board.

7. The device of claim 6, wherein the magnet is mounted such that opposing poles of the second magnet and the magnet are oriented towards one another, and the magnetic plate and the magnet attract one another.

8. The device of claim 6, wherein the device is configured such that a rest position of the key includes the magnet contacting the second magnet.

9. The device of claim 1, wherein the flange of the set of flanges includes a surface oriented towards the circuit board, and wherein the magnet is mounted to the surface.

10. The device of claim 9, further including a magnetic plate mounted on a surface of the webbing oriented towards the circuit board.

11. The device of claim 10, wherein the magnet is mounted such that opposing poles of the magnetic plate and the magnet are oriented towards one another, and the magnetic plate and the magnet attract one another.

12. The device of claim 10, wherein the device is configured such that a rest position of the key includes the flanges contacting the magnetic plate.

13. The device of claim 1, wherein the keycap includes a surface opposite of the contact surface, the surface being oriented towards the circuit board.

14. The device of claim 13, further including a second magnet between the magnet and the circuit board.

15. The device of claim 14, wherein the second magnet is positioned such that identical poles of the magnetic plate and the magnet are oriented towards one another, and the magnetic plate and the magnet repel one another.

16. The device of claim 14, wherein the device is configured such that a rest position of the key includes the flanges contacting the webbing.

17. The device of claim 1, further comprising a set of rails positioned between the webbing and the circuit board, the set of rails being positioned to limit movement of the keycap laterally between the circuit board and the webbing.

18. The device of claim 17, wherein the flange of the set of flanges includes a hole for receiving a rail of the set of rails.

19. The device of claim 17, wherein the flange of the set of flanges includes a slot for receiving a rail of the set of rails.

20. The device of claim 17, wherein the rails of the set of rails are positioned along the set of flanges.

21. The device of claim 1, wherein the input apparatus includes a mechanical switch configured to indicate to the processor that the key has been pressed when the mechanical switch is contacted.

22. The device of claim 1, wherein the input apparatus includes a magnetic field sensor.

23. The device of claim 1, wherein the input apparatus includes a Hall-effect sensor.

24. The device of claim 1, wherein the input apparatus is configurable to allow a user to adjust sensitivity of the key.

* * * * *